US009082751B2

(12) United States Patent
Chen et al.

(10) Patent No.: US 9,082,751 B2
(45) Date of Patent: Jul. 14, 2015

(54) HALF-FINFET SEMICONDUCTOR DEVICE AND RELATED METHOD

(75) Inventors: Xiangdong Chen, Irvine, CA (US); Wei Xia, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 956 days.

(21) Appl. No.: 13/232,737

(22) Filed: Sep. 14, 2011

(65) Prior Publication Data
US 2013/0062692 A1    Mar. 14, 2013

(51) Int. Cl.
*H01L 29/66*   (2006.01)
*H01L 29/423*  (2006.01)
*H01L 29/78*   (2006.01)
*H01L 29/06*   (2006.01)

(52) U.S. Cl.
CPC ........ *H01L 29/4236* (2013.01); *H01L 29/0653* (2013.01); *H01L 29/66659* (2013.01); *H01L 29/66787* (2013.01); *H01L 29/7835* (2013.01); *H01L 29/0692* (2013.01)

(58) Field of Classification Search
CPC ............ H01L 29/0696; H01L 29/0839; H01L 29/0886; H01L 29/1079; H01L 29/7831; H01L 29/7834; H01L 21/823418; H01L 21/823814
USPC .......... 257/170, 334, 571, 586, 618, 624, 920
See application file for complete search history.

(56) References Cited

U.S. PATENT DOCUMENTS

| 8,125,029 B2* | 2/2012 | Kocon ........................ 257/341 |
| 2006/0138552 A1* | 6/2006 | Brask et al. ................. 257/369 |
| 2011/0101455 A1 | 5/2011 | Basker et al. | |

FOREIGN PATENT DOCUMENTS

| CN | 202816956 U | 3/2013 |
| TW | 200713467 | 4/2007 |

OTHER PUBLICATIONS

Office Action issued on Jul. 21, 2014 in Taiwanese Application No. 101130974. (6 pages).
Office Action issued on Dec. 31, 2014 in Chinese Application No. 201210343269.0. (5 pages).

* cited by examiner

*Primary Examiner* — Mohammad Islam
*Assistant Examiner* — Joannie A Garcia
(74) *Attorney, Agent, or Firm* — Oblon, McClelland, Maier & Neustadt, L.L.P.

(57) ABSTRACT

According to one embodiment, a half-FinFET semiconductor device comprises a gate structure formed over a semiconductor body. The semiconductor body includes a source region comprised of a plurality of fins extending beyond a first side of the gate structure and a continuous drain region adjacent a second side of the gate structure opposite the plurality of fins. The continuous drain region causes the half-FinFET semiconductor device to have a reduced ON-resistance. A method for fabricating a semiconductor device having a half-FinFET structure comprises designating source and drain regions in a semiconductor body, etching the source region to produce a plurality of source fins while masking the drain region during the etching to provide a continuous drain region, thereby resulting in the half-FinFET structure having a reduced ON-resistance.

20 Claims, 7 Drawing Sheets

HALF-FINFET SEMICONDUCTOR DEVICE AND RELATED METHOD

BACKGROUND OF THE INVENTION

1. Field of the Invention

The present invention is generally in the field of semiconductors. More specifically, the present invention is in the field of fabrication of semiconductor transistors.

2. Background Art

Complementary metal-oxide-semiconductor (CMOS) technology is widely utilized in the semiconductor industry due to its numerous advantages. For example, the high density, low power consumption, and relative noise immunity associated with CMOS devices make them desirable for implementation in integrated circuits (ICs), to provide control logic for modem electronic systems, for instance. However, standard CMOS transistors are typically low voltage devices. As a result, power applications, such as power switching and voltage regulation, for example, are typically performed by high power versions of metal-oxide-semiconductor field-effect transistors (MOSFETs), such as lateral diffused metal-oxide-semiconductor (LDMOS) devices, often fabricated alongside the CMOS logic devices on the IC die.

Not surprisingly, one important measure of LDMOS device performance is its breakdown voltage, which should preferably be high. Yet another important measure of LDMOS performance is its ON-resistance, or $R_{dson}$, which should preferably be quite low. As device dimensions continue to be reduced, so called short-channel effects, such as channel leakage, can result in undesirable power loss even when a transistor is nominally OFF. In an attempt to reduce or substantially eliminate OFF-state leakage in standard CMOS transistors, CMOS fabrication is increasingly moving to fin-based field-effect transistor (FinFET) architectures, due in part to the improved channel depletion achievable using FinFET designs. However, adoption of the FinFET architecture renders implementation of an LDMOS having a desirably low $R_{dson}$ significantly more challenging.

Strategies for lowering $R_{dson}$ in conventional LDMOS device structures may include manipulating the proximity of the transistor gate and various drain side features. For example, the $R_{dson}$ of a conventional LDMOS device can be lowered by reducing the width of a shallow trench isolation (STI) structure formed between the gate and the highly doped drain region, or by increasing the overlap of the gate over the drain extension well surrounding the STI structure. However, those conventional modifications of the LDMOS device undertaken to advantageously reduce $R_{dson}$ may concurrently and undesirably result in a reduced breakdown voltage for the LDMOS device.

Thus, there is a need to overcome the drawbacks and deficiencies in the art by providing a solution compatible with emerging CMOS process flows, capable of producing a power MOSFET configured to concurrently exhibit low $R_{dson}$ and robust resistance to voltage breakdown.

SUMMARY OF THE INVENTION

The present application is directed to a half-FinFET semiconductor device and related method, substantially as shown in and/or described in connection with at least one of the figures, as set forth more completely in the claims.

DETAILED DESCRIPTION OF THE INVENTION

The present invention is directed to a half-FinFET semiconductor device and related method. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
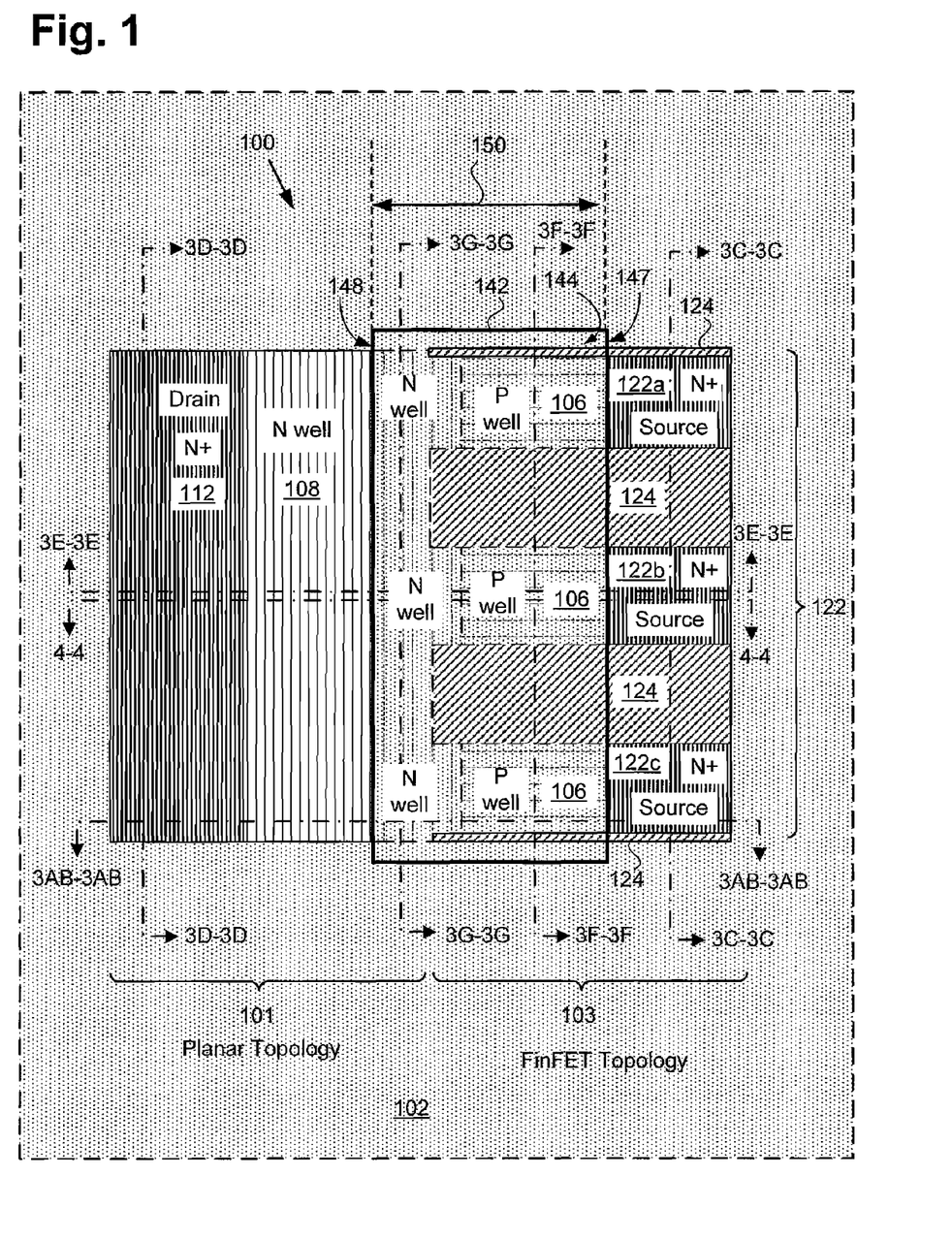
FIG. 1 shows a top view of a half-FinFET semiconductor device implemented as a lateral diffused metal-oxide-semiconductor (LDMOS) device, according to one embodiment of the present invention.

FIG. 1 shows a top view of half-FinFET semiconductor device 100 implemented as a lateral diffused metal-oxide-semiconductor (LDMOS) device, according to one embodiment of the present invention, capable of overcoming the drawbacks and deficiencies associated with the conventional art. As shown in FIG. 1, half-FinFET semiconductor device 100, which is represented as an n-channel metal-oxide-semiconductor (NMOS) device, may be fabricated in semiconductor body 102, which may comprise silicon, for example. Half- FinFET semiconductor device 100 comprises gate structure 142 including gate 144 formed over channel region 150 in semiconductor body 102, source region 122 comprising a plurality of source fins 122a, 122b, and 122c (hereinafter "source fins 122a-122c") separated and bordered by isolation regions 124, and continuous drain region 112. According to the present embodiment, source fins 122a-122c extend beyond side 147 of gate structure 142, while continuous drain region 112 is disposed adjacent side 148 of gate structure 142 opposite source fins 122a-122c. As may be seen in FIG. 1, continuous drain region 112 is spaced apart from side 148 of gate structure 142 by drain extension well 108, which is also shown to be a continuous region (e.g., not one comprised of fins) and further to extend under gate structure 142. In addition, FIG. 1 shows P type body well regions 106 underlying gate structure 142.

Also indicated in FIG. 1 are planar topology portion 101 of half-FinFET semiconductor device 100, characterizing continuous drain region 112, drain extension well 108, and a portion of channel region 150, and FinFET topology portion 103 of half-FinFET semiconductor device 100, characterizing source region 122 and another portion of channel region 150 contiguous with source fins 122a-122c. It is noted that gate structure 142 is shown in transparent outline and gate 144 is shown as a top surface of gate structure 142 in order to represent the dual planar/FinFET nature of channel region 150. In other words, FIG. 1 shows that a portion of channel region 150 adjoining drain extension well 108 is implemented as a continuous (e.g., planar) channel region, while the portion of channel region contiguous with source fins 122a-122c is implemented using channel fins disposed under gate structure 142, each channel fin comprising a P type body well region 106 contiguous with a respective one of source fins 122a-122c.

By utilizing a half-FinFET device topology in which source region 122, and channel region 150 disposed under gate structure 142 and contiguous with source fins 122a-122c, adopt FinFET topology 103, while continuous drain region 112, drain extension well 108, and a portion of channel region 150 adjoining drain extension well 108 are implemented using traditional planar transistor topology 101, embodiments of the present invention are configured to have a reduced ON-resistance ($R_{dson}$) when compared to an LDMOS device implemented using a more conventional FinFET structure. That is to say, embodiments of the present invention are configured to advantageously achieve the low $R_{dson}$ desirable in an LDMOS device and to provide the high voltage breakdown resistance required of an LDMOS device, while concurrently enabling the performance advantages associated with FinFET devices, such as reduced OFF-state channel leakage, for example.

Half-FinFET semiconductor device 100 may be suitable for use in a power management circuit or power amplifier (PA) implemented in a mobile communication device, for example. In addition, because fabrication of half-FinFET semiconductor device 100 can be performed using processing steps presently included in and/or contemplated for emerging complementary metal-oxide-semiconductor (CMOS) foundry process flows, half-FinFET semiconductor device 100 may be advantageously fabricated alongside standard CMOS devices, and may be monolithically integrated with CMOS logic, for example, in an integrated circuit (IC) fabricated on a semiconductor wafer or die comprising semiconductor body 102. For example, half-FinFET semiconductor device 100 may be fabricated using a FinFET fabrication process at the 22 nm technology node as well as other technology nodes. Indeed, the present inventive principles are scalable with additional advances in fabrication technology below the 22 nm node.

It is noted that the specific features represented in FIG. 1 are provided as part of an example implementation of the present inventive principles, and are shown with such specificity as an aid to conceptual clarity. Because of the emphasis on conceptual clarity, it should be understood that the structures and features depicted in FIG. 1, as well as those depicted in FIGS. 3A, 3B, 3C, 3D, 3E, 3F, 3G, and 4, may not be drawn to scale. Furthermore, it is noted that particular details such as the type of semiconductor device represented by half-FinFET semiconductor device 100, its overall layout, and the particular dimensions attributed to its features are merely being provided as examples, and should not be interpreted as limitations.

For example, although the embodiment shown in FIG. 1 characterizes half-FinFET semiconductor device 100 as an NMOS device, more generally, a half-FinFET semiconductor device according to the present inventive principles can comprise an NMOS or PMOS device. Furthermore, in some embodiments, the principles disclosed herein can be implemented to fabricate one or more fundamentally distinct device types, such as a BiCMOS device, for example.

Figure 2:
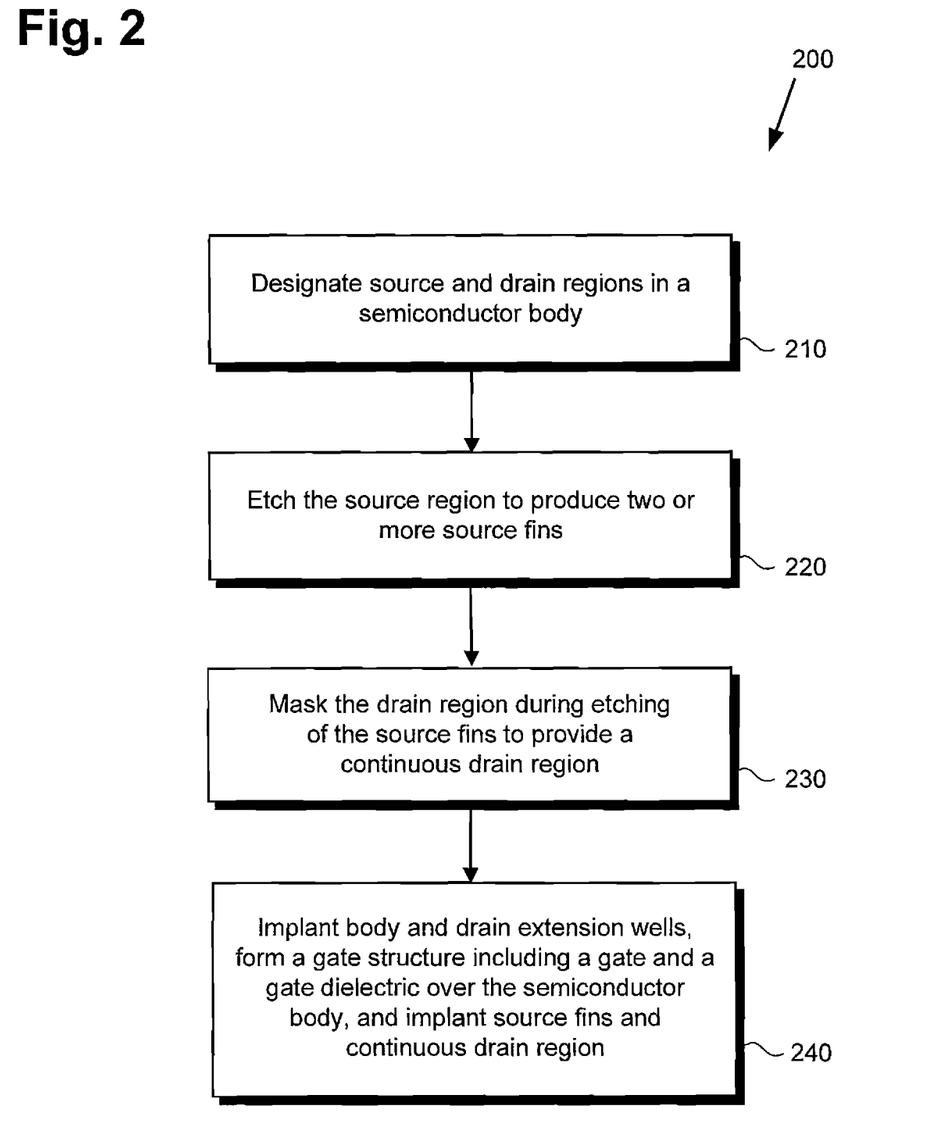
FIG. 2 is a flowchart presenting a method for fabricating a semiconductor device having a half-FinFET structure, according to one embodiment of the present invention.
Figure 3A:
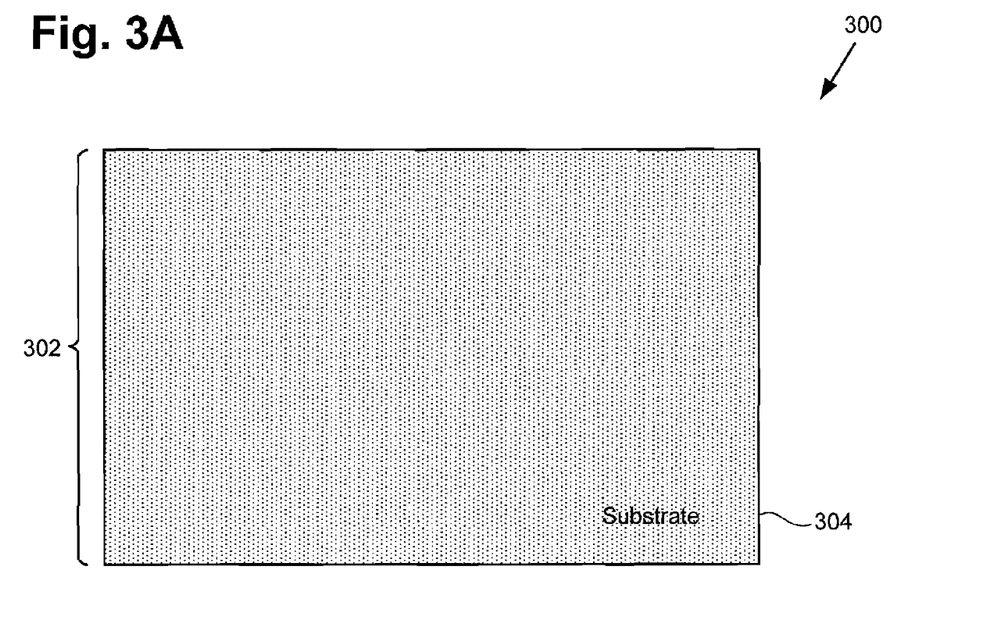
FIG. 3A provides a cross-sectional view along perspective line 3AB-3AB in FIG. 1, of a half-FinFET semiconductor device at an early fabrication stage, according to one embodiment of the present invention.
Figure 3B:
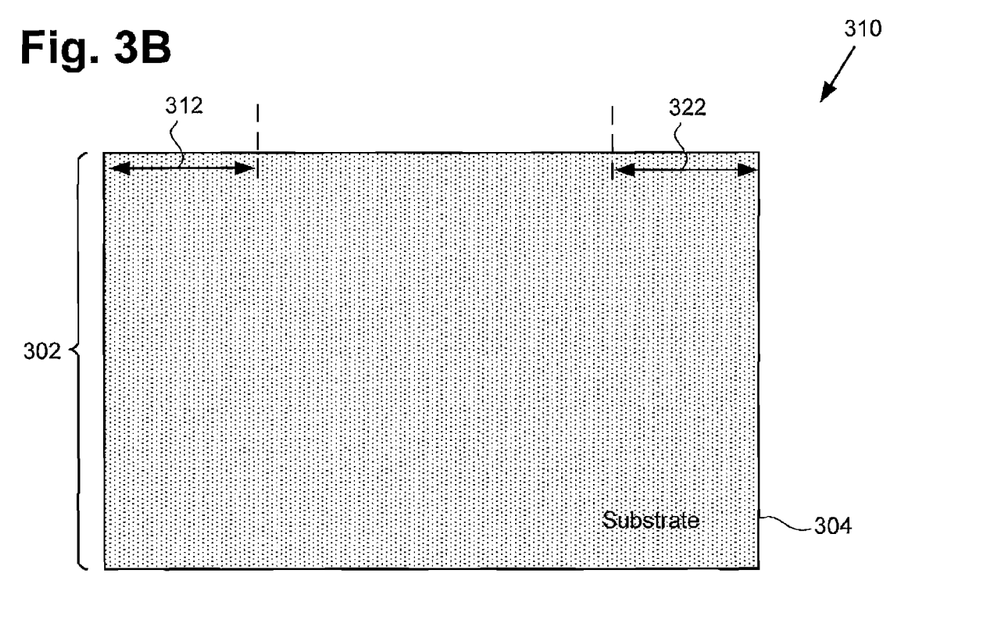
FIG. 3B provides a cross-sectional view along perspective line 3AB-3AB in FIG. 1, of a half-FinFET semiconductor device at an early fabrication stage, according to one embodiment of the present invention.
Figure 3C:
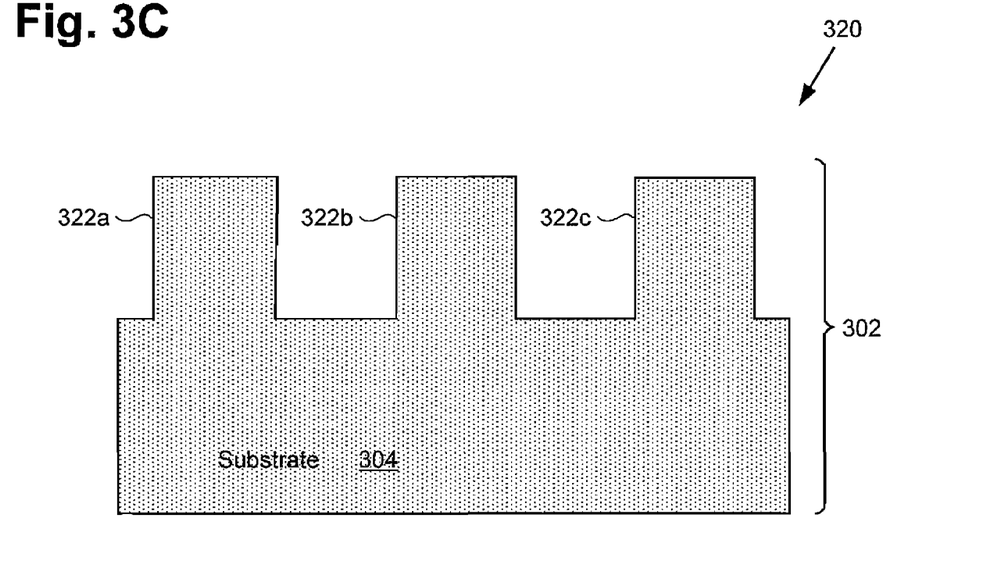
FIG. 3C provides a cross-sectional view along perspective line 3C-3C in FIG. 1, of a half-FinFET semiconductor device at an intermediate fabrication stage, according to one embodiment of the present invention.
Figure 3D:
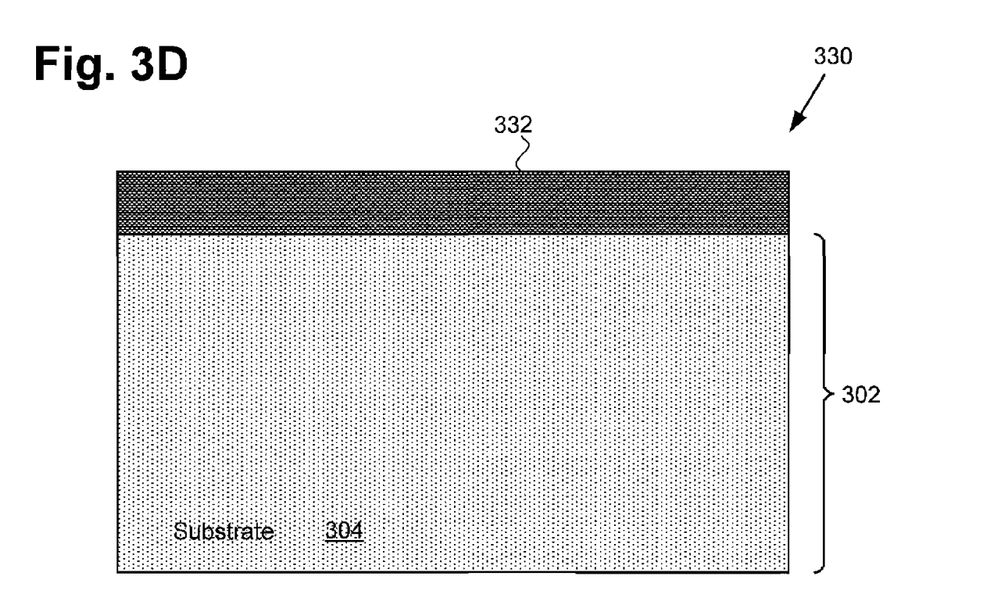
FIG. 3D provides a cross-sectional view along perspective line 3D-3D in FIG. 1, of a half-FinFET semiconductor device at an intermediate fabrication stage, according to one embodiment of the present invention.
Figure 3E:
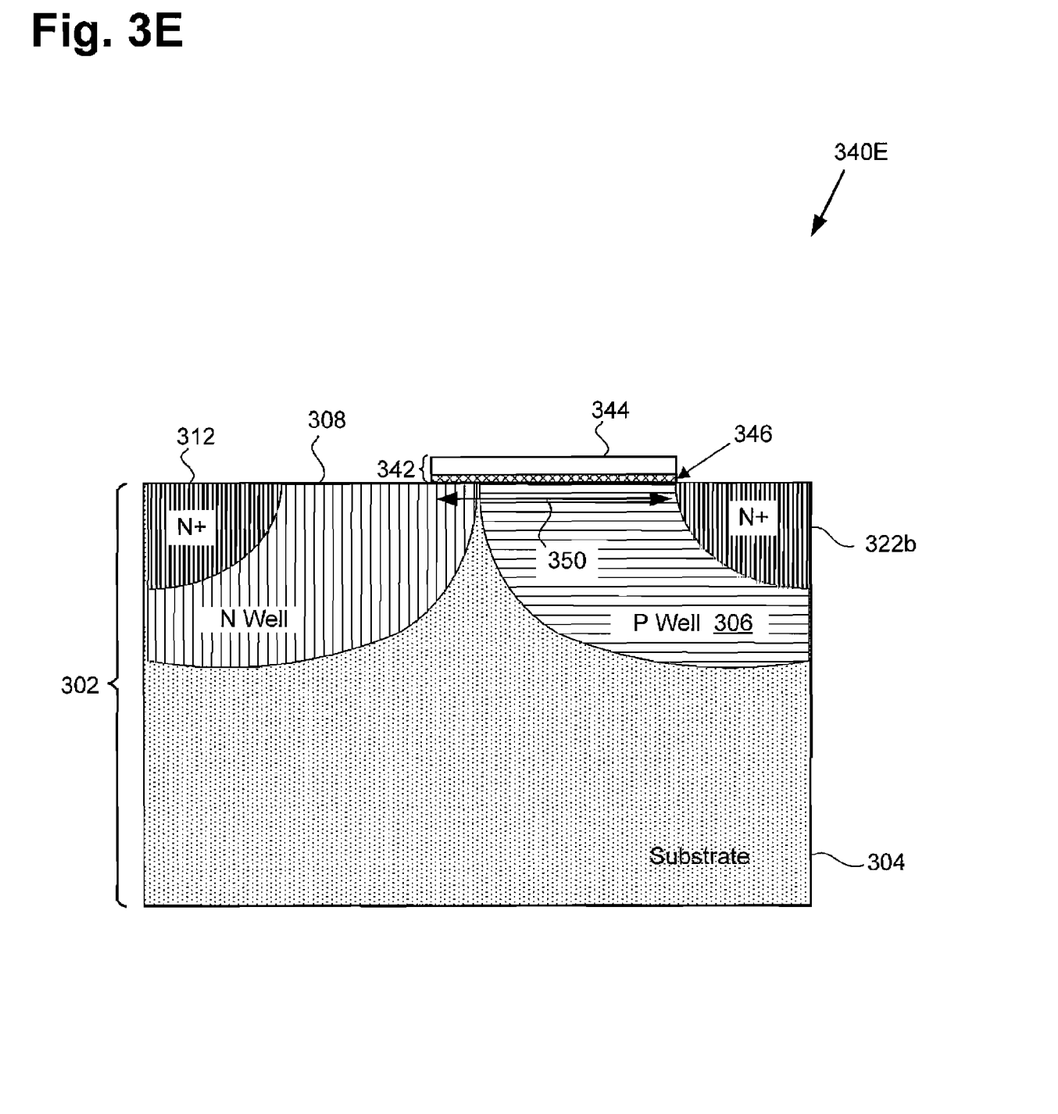
FIG. 3E provides a cross-sectional view along perspective line 3E-3E in FIG. 1, of a half-FinFET semiconductor device, according to one embodiment of the present invention.
Figure 3F:
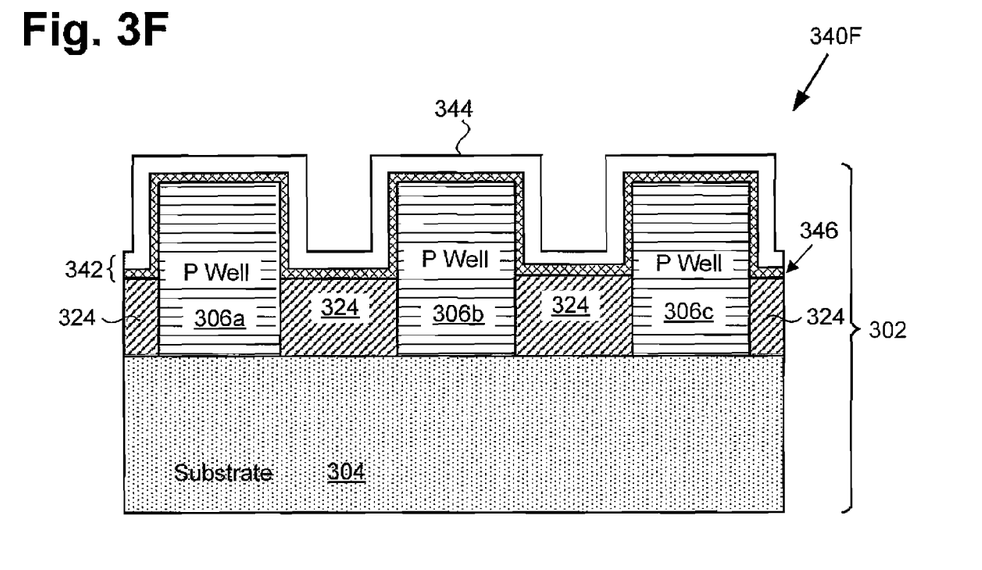
FIG. 3F provides a cross-sectional view along perspective line 3F-3F in FIG. 1, of a half-FinFET semiconductor device corresponding to the device shown in FIG. 3E, according to one embodiment of the present invention.
Figure 3G:
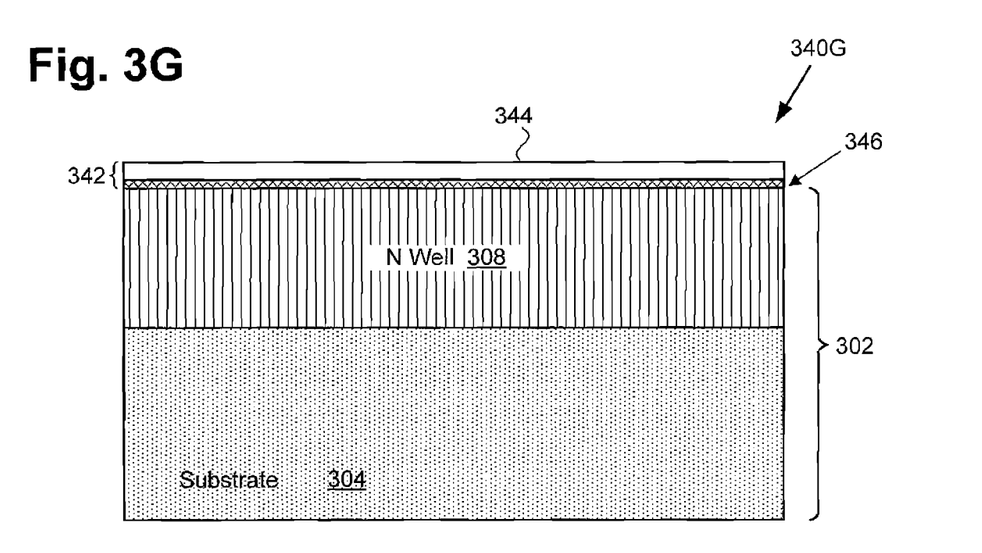
FIG. 3G provides a cross-sectional view along perspective line 3G-3G in FIG. 1, of a half-FinFET semiconductor device corresponding to the device shown in FIG. 3E, according to one embodiment of the present invention.
Figure 4:
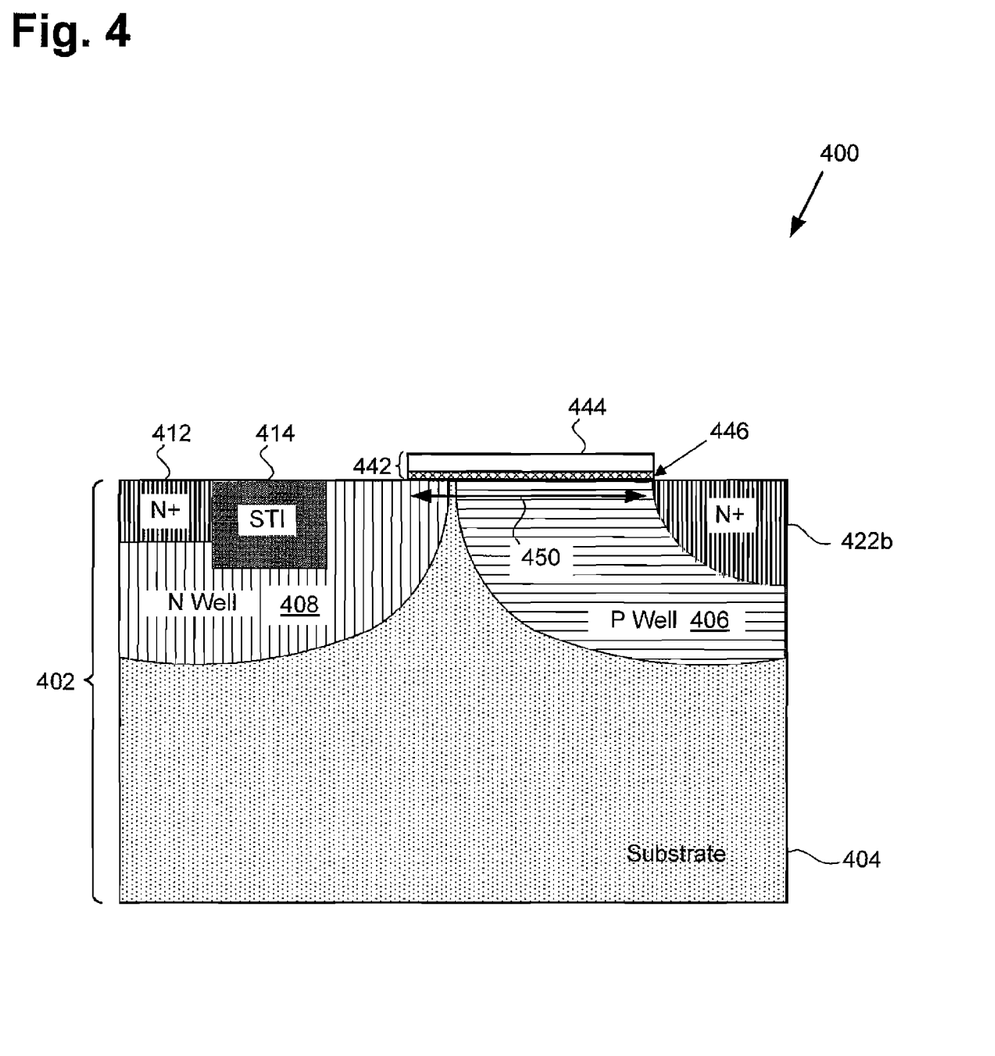
FIG. 4 provides a cross-sectional view along perspective line 4-4 in FIG. 1, of a half-FinFET semiconductor device, according to another embodiment of the present invention.

Half-FinFET semiconductor device 100 will be further described in combination with FIGS. 2, 3A, 3B, 3C, 3D, 3E, 3F, and 3G, while an alternative embodiment of half-FinFET semiconductor device 100 is shown in FIG. 4. Referring to FIG. 2, FIG. 2 shows flowchart 200 presenting a method, according to one embodiment of the present invention, for fabricating a semiconductor device having a half-FinFET structure. Certain details and features have been left out of flowchart 200 that are apparent to a person of ordinary skill in the art. For example, a step may comprise one or more sub-steps or may involve specialized equipment or materials, as known in the art. While steps 210 through 240 indicated in flowchart 200 are sufficient to describe one embodiment of the present invention, other embodiments of the present invention may utilize steps different from those shown in flowchart 200, and may include more, or fewer, steps.

Referring now to FIG. 3A, structure 300 in FIG. 3A provides a cross-sectional view along perspective line 3AB-3AB in FIG. 1, of half-FinFET semiconductor device 100 at an early fabrication stage, according to one embodiment of the present invention. Structure 300, in FIG. 3A, shows semiconductor body 302 comprised of substrate 304, which may be a Group IV semiconductor substrate, such as a P type substrate comprising silicon or germanium, for example. Semiconductor body 302 comprising substrate 304 corresponds to semiconductor body 102, in FIG. 1. It is noted that structure 300, in FIG. 3A, shows a portion of semiconductor body 102, in FIG. 1, along perspective line 3AB-3AB, before processing step 210 of flowchart 200 in FIG. 2.

Referring to FIGS. 3B, 3C, 3D, 3E, 3F, and, 3G, structures 310, 320, 330, 340E, 340F, and 340G show the result of performing, on semiconductor body 102, steps 210, 220, 230, and 240 of flowchart 200 of FIG. 2, respectively, as viewed along perspective lines 3AB-3AB, 3C-3C, 3D-3D, 3E-3E, 3F-3F, and 3G-3G, respectively. For example, structure 310 shows structure 300 after processing step 210, structure 320 shows semiconductor body 102 along perspective line 3C-3C after processing step 220, and so forth. It is noted that FIGS. 3E, 3F, and 3G show a structure after processing step 340 (e.g., a structure corresponding to half-FinFET semiconductor device 100, in FIG. 1) from three different vantage points along perspective lines 3E-3E, 3F-3F, and 3G-3G, in FIG. 1, and are correspondingly labeled as structures 340E, 340F, and 340G in respective FIGS. 3E, 3F, and 3G.

Referring to step 210 in FIG. 2, with additional reference to structure 310, shown in FIG. 3B, step 210 of flowchart 200 comprises designating source and drain regions in semiconductor body 302. As shown in FIG. 3B, step 210 corresponds to designating region 322 for formation of a source region of a half-FinFET semiconductor device and designating region 312 for formation of a drain region of the half-FinFET semiconductor device.

Moving on to step 220 in FIG. 2 and referring to structure 320 in FIG. 3C, step 220 of flowchart 200 comprises etching the source region to produce source fins 322a, 322b, and 322c (hereinafter "source fins 322a-322c"). FIG. 3C presents a cross-sectional view of half-FinFET structure 320, corresponding to perspective line 3C-3C in FIG. 1, prior to formation of isolation regions 124 and implantation of source region 122. As such, source fins 322a-322c may be seen to correspond respectively to source fins 122a-122c at an intermediate fabrication stage. Source fins 322a-322c may be formed in semiconductor body 302 using a plasma etch, or other dry etch process, for example, as known in the art, and may comprise silicon fins.

Continuing with step 230 in FIG. 2 and referring to structure 330 in FIG. 3D, step 230 of flowchart 200 comprises masking the drain region during etching of source fins 322a-322c in FIG. 3C to provide a continuous drain region. FIG. 3D presents a cross-sectional view of half-FinFET structure 330, corresponding to perspective line 3D-3D in FIG. 1, prior to implantation of P type body well 106, N type drain extension well 108, and continuous drain region 112. As shown in FIG. 3D, step 230 may be performed by forming mask 332 over drain region 312 designated in substrate 304. Mask 332 may take the form of a photoresist layer, for example, comprising a polymer matrix including styrene, acrylate, or methacrylate monomers, for instance. Mask 332 can be formed by any suitable deposition process, as known in the art. Referring back to FIG. 1, the presence of mask 332 over drain region 312 during step 220 results in drain region 312 being provided as continuous drain region 112 despite the etching process resulting in production of source fins 122a-122c, thereby resulting in the half-FinFET structure of half-FinFET semiconductor device 100.

It is emphasized that although steps 220 and 230 are described as distinct steps herein as a conceptual aid, in practice, the masking process utilized in step 230 is contemplated as being the same masking process used to enable formation of source fins 322a-322c, shown in FIG. 3C. Thus, the present inventors contemplate that steps 220 and 230 of flowchart 200 may be executed substantially concurrently.

Moving now to step 240 in FIG. 2 and referring to structure 340E in FIG. 3E, step 240 of flowchart 200 comprises implanting body well 306 and drain extension well 308, forming gate structure 342 including gate 344 and gate dielectric 346 between continuous drain region 312 and the source region including source fin 322b, and implanting continuous drain region 312 and the source region including source fin 322b. FIG. 3E presents a cross-sectional view of half-FinFET structure 340E, corresponding to perspective line 3E-3E in FIG. 1. Structure 340E, in FIG. 3E, shows semiconductor body 302 comprised of substrate 304, P type body well 306 formed in or over substrate 304, and N type drain extension well 308 formed in or over substrate 304. In some embodiments, P type body well 306 and N type drain extension well 308 may be formed in an epitaxial semiconductor layer, such as a silicon or germanium epitaxial layer, formed on substrate 304. Alternatively, in some embodiments, P type body well 306 and N type drain extension well 308 can be formed within substrate 304. Also shown in FIG. 3E, is gate structure 342 comprising gate 344 and gate dielectric 346 disposed between gate 344 and channel region 350. P type body well 306, N type drain extension well 308, channel region 350, gate structure 342, and gate 344 correspond respectively to P type body well 106, N type drain extension well 108, channel region 150, gate structure 142, and gate 144, in FIG. 1.

As explained above, it may be understood from the depictions shown by FIGS. 1 and 3E that channel region 350 may include a plurality of fin regions formed in P type body well 306 contiguous with respective source fins 122a-122c and extending through and/or under gate structure 142/342 to adjoin drain extension well 308, which may also extend under gate structure 342, as shown in FIG. 3E. Moreover, gate structure 142 in FIG. 1 may be implemented as a multi-gate structure, such as a so called "tri-gate", having multiple planar interfaces with the channel fins contiguous with source fins 122a-122c.

Such an embodiment is shown more explicitly in FIG. 3F, which depicts a cross-sectional view of structure 340F along perspective line 3F-3F in FIG. 1, according to one embodiment of the present invention. As may be understood by reference to FIG. 3F in combination with FIG. 1, structure 340F corresponds to a portion of channel region 150 underlying gate structure 142 and implemented using FinFET topology 103. FIG. 3F shows a plurality of channel fins comprising P type body well fins 306a, 306b, and 306c (hereinafter "channel fins 306a-306c") separated and bordered by isolation regions 324 corresponding to isolation regions 124, in FIG. 1. Moreover, as shown in FIG. 3F, gate structure 342 including gate 344 and gate dielectric 346 may be conformally deposited over channel fins 306a-306c to provide the multi-gate type topology described above.

By contrast, FIG. 3G depicts a cross-sectional view of structure 340G along perspective line 3G-3G in FIG. 1, and corresponds to a portion of channel region 150 underlying gate structure 142 and implemented using planar topology 101. FIG. 3G shows continuous N type drain extension well 308 formed in or over substrate 304, and corresponds to the portion of channel region 150 adjoining drain extension well 108, in FIG. 1. As further shown in FIG. 3G, structure 340G includes laterally planar gate structure 342 including gate 344 and gate dielectric 346 formed over drain extension well 308.

Gate 344 may comprise polysilicon, for example, and may be formed over a suitable gate dielectric 346, such as silicon oxide ($SiO_2$) or silicon nitride ($Si_3N_4$). Alternatively, gate 344 may comprise a gate metal and gate dielectric 346 may be implemented as a high-κ dielectric such as hafnium oxide ($HfO_2$), zirconium oxide ($ZrO_2$), or the like, using the appropriate known CMOS fabrication step(s). For example, in embodiments in which structure 340 corresponds to an n-channel device, gate 344 may be formed of any gate metal suitable for use in an NMOS device, such as tantalum (Ta), tantalum nitride (TaN), or titanium nitride (TiN), for example. Moreover, in embodiments in which structure 340 is adapted so as to correspond to a p-channel device, gate 344 may be formed of any gate metal suitable for use in a PMOS device, such as molybdenum (Mo), ruthenium (Ru), or tantalum carbide nitride (TaCN), for example.

Referring to FIG. 4, FIG. 4 shows a cross-sectional view of half-FinFET semiconductor device 400, according to another embodiment of the present invention, from a vantage point corresponding to perspective line 4-4 in FIG. 1. Half-FinFET semiconductor device 400, in FIG. 4, comprises semiconductor body 402 including substrate 404, P type well region 406, N type drain extension well 408, source fin 422b, continuous drain region 412 and channel region 450, corresponding to semiconductor body 302 including substrate 304, P type well region 306, N type drain extension well 308, source fin 322b, continuous drain region 312 and channel region 350, in FIG. 3E. In addition, FIG. 4 shows gate structure 442 formed over semiconductor body 402 and disposed over channel region 450. Gate structure 442 includes gate 444 and gate dielectric 446, and corresponds to gate structure 342 including gate 344 and gate dielectric 346, in FIG. 3E.

Also shown in FIG. 4 is isolation body 414 having no analogue in the previous figures. Isolation body 414 is formed between continuous drain region 412 and gate structure 442. Isolation body 414 may comprise a shallow trench isolation (STI) structure, such as an STI structure formed of $SiO_2$, for example, and may be formed according to known CMOS fabrication process steps. According to the embodiment shown in FIG. 4, isolation body 414 may be implemented to provide additional voltage breakdown resistance to half-FinFET structure 400. Moreover, the embodiment shown in FIG. 4, like half-FinFET semiconductor device 100 in FIG. 1, is configured to have a reduced ON-resistance ($R_{dson}$) when compared to an LDMOS device implemented using a more conventional FinFET structure. That is to say, the embodiment of FIG. 4 is capable of achieving the low $R_{dson}$ desirable in an LDMOS device, to provide improved high voltage breakdown resistance by virtue of isolation body 414, and to concurrently enable the performance advantages associated with the FinFET design.

Thus, by adopting a half-FinFET topology for implementing a semiconductor device, embodiments of the present invention advantageously enable the performance improvements, such as reduced OFF-state leakage, associated with FinFET designs. In addition, by retaining a planar transistor topology on the drain side of a half-FinFET semiconductor device implemented as an LDMOS device, embodiments of the present invention provide robust voltage resistance and a reduced $R_{dson}$. Moreover, by harmonizing fabrication of a half-FinFET semiconductor device with existing CMOS process flows, the present application discloses devices that are not only compatible with CMOS fabrication processes at the 22 nm technology node as well as other technology nodes, but devices that can advantageously be fabricated without substantial additional processing steps beyond those required for fabrication of ordinary CMOS transistors. Furthermore, the embodiments of a half-FinFET device disclosed herein are contemplated to advantageously scale with advances in fabrication processes below the 22 nm technology node.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A half-FinFET semiconductor device comprising:
   a gate structure formed over a semiconductor body;
   said semiconductor body including a source region comprised of a plurality of fins extending beyond a first side of said gate structure;
   said semiconductor body further comprising a continuous drain region adjacent to a second side of said gate structure which is opposite of said plurality of fins; and
   a drain extension well that is formed in between the continuous drain region and the gate structure.

2. The half-FinFET semiconductor device of claim 1, further comprising a channel region situated under said gate structure and contiguous with said plurality of fins.

3. The half-FinFET semiconductor device of claim 1, wherein said half-FinFET semiconductor device is an n-channel metal-oxide-semiconductor (NMOS) device.

4. The half-FinFET semiconductor device of claim 1, wherein said half-FinFET semiconductor device is a p-channel metal-oxide-semiconductor (PMOS) device.

5. The half-FinFET semiconductor device of claim 1, wherein said half-FinFET semiconductor device is a lateral diffused metal-oxide-semiconductor (LDMOS) device.

6. The half-FinFET semiconductor device of claim 1, wherein said half-FinFET semiconductor device further comprises an isolation body formed between said continuous drain region and said gate structure.

7. The half-FinFET semiconductor device of claim 1, wherein said plurality of fins are silicon fins.

8. The half-FinFET semiconductor device of claim 1, wherein said gate structure comprises a gate and a gate dielectric disposed between said gate and said semiconductor body.

9. The half-FinFET semiconductor device of claim 1, wherein said gate structure comprises a polysilicon gate and a gate dielectric selected from one of silicon oxide and silicon nitride disposed between said polysilicon gate and said semiconductor body.

10. The half-FinFET semiconductor device of claim 1, wherein said gate structure comprises a metal gate and a high-κ gate dielectric disposed between said metal gate and said semiconductor body.

11. The half-FinFET semiconductor device of claim 1, wherein said continuous drain region causes said half-FinFET semiconductor device to have a reduced ON-resistance.

12. The half-FinFET semiconductor device of claim 6, wherein the isolation body is directly adjacent to the continuous drain region.

13. The half-FinFET semiconductor device of claim 12, wherein the isolation body is not under the gate structure.

14. The half-FinFET semiconductor device of claim 1, further comprising:
   isolation regions that are disposed in between the plurality of fins.

15. The half-FinFET semiconductor device of claim 1, wherein the gate structure is not in direct contact with the continuous drain region.

16. The half-FinFET semiconductor device of claim 1, wherein the continuous drain region does not include a plurality of fins.

17. The half-FinFET semiconductor device of claim 1, wherein the gate structure is in direct contact with the drain extension well.

18. A half-FinFET semiconductor device comprising:
   a gate structure formed over a semiconductor body;
   said semiconductor body including a source region comprised of a plurality of fins and a continuous drain region; and
   a drain extension well that is formed in between the continuous drain region and the gate structure, wherein said continuous drain region causes said half-FinFET semiconductor device to have a reduced ON-resistance.

19. A half-FinFET semiconductor device comprising:
a semiconductor body including a source region comprised of a plurality of fins extending beyond a first side of a gate structure;
said semiconductor body further comprising a continuous drain region adjacent to a second side of said gate structure which is opposite of said plurality of fins; and
a drain extension well that is formed in between the continuous drain region and the gate structure.

20. The half-FinFET semiconductor device of claim 1, wherein the drain extension well is formed below the continuous drain region.

* * * * *